(12) United States Patent
Liu

(10) Patent No.: US 12,513,895 B2
(45) Date of Patent: Dec. 30, 2025

(54) SEMICONDUCTOR STRUCTURE AND METHOD FOR PREPARING SAME

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGIES, INC., Hefe (CN)

( * ) Notice: Subject to any disclaimer, the term of this patent is extended or adjusted under 35 U.S.C. 154(b) by 711 days.

(21) Appl. No.: 17/879,039

(22) Filed: Aug. 2, 2022

(65) Prior Publication Data
US 2023/0337416 A1 Oct. 19, 2023

Related U.S. Application Data

(63) Continuation of application No. PCT/CN2022/090288, filed on Apr. 29, 2022.

(30) Foreign Application Priority Data

Apr. 15, 2022 (CN) .......................... 202210398939.2

(51) Int. Cl.
| H01L 27/108 | (2006.01) |
| H10B 12/00 | (2023.01) |
| H10D 30/01 | (2025.01) |
| H10D 30/62 | (2025.01) |

(52) U.S. Cl.
CPC ........... H10B 12/36 (2023.02); H10B 12/482 (2023.02); H10D 30/024 (2025.01); H10D 30/6211 (2025.01)

(58) Field of Classification Search
CPC ...... H10B 12/36; H10B 12/482; H10B 12/05; H10D 30/024; H10D 30/6211; H10D 84/0158; H10D 84/038
See application file for complete search history.

(56) References Cited

U.S. PATENT DOCUMENTS

2021/0391454 A1* 12/2021 Tu ..................... H10D 84/0158

* cited by examiner

*Primary Examiner* — Mohammed R Alam
(74) *Attorney, Agent, or Firm* — Syncoda LLC; Feing Ma

(57) ABSTRACT

A method for preparing a semiconductor structure, including: providing a structure to be processed which includes a semiconductor substrate, semiconductor fins extending along a first direction on the semiconductor substrate, and a first filling layer which fills gaps between two adjacent ones of the semiconductor fins; forming a first protective layer on the structure to be processed, and patterning the first protective layer; and etching the semiconductor fins and the first filling layer along a second direction intersecting the first direction by taking the patterned first protective layer as a mask to etch the semiconductor fins into semiconductor pillars and connecting ridges connecting two adjacent ones of the semiconductor pillars, in which an upper surface of the connecting ridge is higher than the upper surface of the first filling layer at both sides of the connecting ridge.

7 Claims, 66 Drawing Sheets

First direction

Second direction

SEMICONDUCTOR STRUCTURE AND METHOD FOR PREPARING SAME

CROSS-REFERENCE TO RELATED APPLICATIONS

The present application is a U.S. continuation application of International Application No. PCT/CN2022/090288, filed on Apr. 29, 2022, which claims priority to Chinese Patent Application No. 202210398939.2, filed on Apr. 15, 2022. International Application No. PCT/CN2022/090288 and Chinese Patent Application No. 202210398939.2 are incorporated herein by reference in their entireties.

BACKGROUND

With the increasing integration level of the manufacturing process of semiconductor, it has become a trend to improve the integration density of memory, so the dimension of integrated circuits is gradually reduced, which increases the difficulty of memory manufacturing. In the process of advanced dynamic random access memory (DRAM), the process level of bit line will directly affect the conductivity of bit lines, and then affect the conduction capability of a chip, and even seriously affect the electrical performance and reliability of the chip in the later stage.

However, there are still some deficiencies in the current process technology of bit lines, and how to optimize the process technology of bit lines is an urgent technical problem to be solved at this stage.

SUMMARY

Embodiments of the disclosure provide a method for preparing a semiconductor structure, including the following operations. A structure to be processed is provided, which includes a semiconductor substrate, a plurality of semiconductor fins extending along a first direction on the semiconductor substrate, and a first filling layer filling gaps between two adjacent ones of the semiconductor fins. A first protective layer is formed on the structure to be processed and is patterned. The semiconductor fins and the first filling layer are etched along a second direction intersecting the first direction by taking the patterned first protective layer as a mask, to etch the semiconductor fins into a plurality of semiconductor pillars and connecting ridges connecting two adjacent ones of the semiconductor pillars, in which the upper surface of the connecting ridge is higher than the upper surface of the first filling layer at both sides of the connecting ridge.

The embodiment of the disclosure also provides a semiconductor structure, including a semiconductor substrate, a plurality of semiconductor fins on the semiconductor substrate, doped regions and bit lines. The semiconductor fins extend along a first direction. Each of the semiconductor fins includes a plurality of semiconductor pillars and connecting ridges connecting two adjacent ones of the semiconductor pillars. An upper surface of the connecting ridge is lower than an upper surface of the semiconductor pillar. The doped regions extend along the first direction, and are located at tops and sidewalls of the connecting ridges and at lower portions of the semiconductor pillars. The bit lines extend along the first direction and cover tops and sidewalls of the doped regions.

Part of additional aspects and advantages of the disclosure will be set forth in the following description, and part will become apparent from the following description or will become apparent through the practice of the disclosure.

BRIEF DESCRIPTION OF THE DRAWINGS

To more clearly illustrate technical solution in embodiments of the disclosure or conventional techniques, drawings required for use in the embodiments will be briefly described below, and it will be apparent that the drawings described below are only some embodiments of the disclosure, from which other drawings may be obtained without creative effort by a person of ordinary skill in the art.

DETAILED DESCRIPTION

Figure 1:
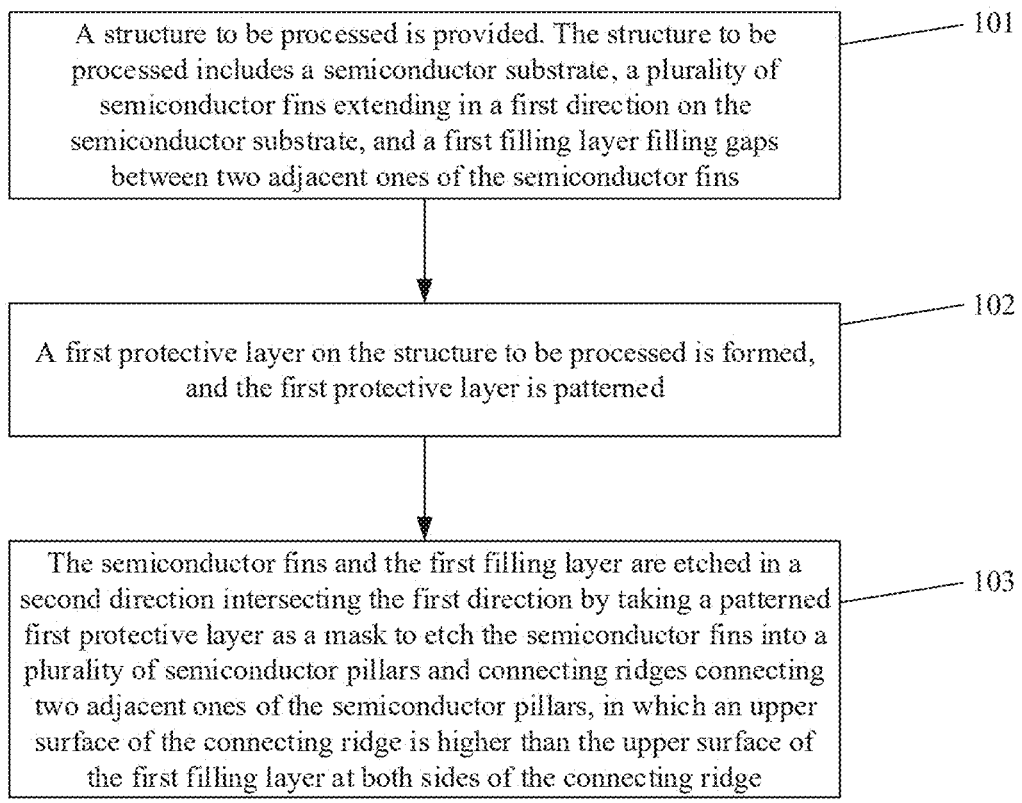
FIG. 1 is a flow diagram of a method for preparing a semiconductor structure provided by embodiments of the disclosure.

The disclosure relates to the field of semiconductor technology, in particular to a semiconductor structure and a method for preparing the same.

Exemplary embodiments of the disclosure will be described in more detail below with reference to the accompanying drawings. Although the exemplary embodiments of the disclosure are shown in the accompanying drawings, it is to be understood that the disclosure may be implemented in various forms and should not be limited by the specific embodiments set forth herein. On the contrary, these embodiments are provided to enable a more thorough understanding of the disclosure and to fully convey the scope of the disclosure to those skilled in the art.

In the drawings, the dimensions of layers, regions, elements and their relative dimensions may be exaggerated for clarity. Throughout, the same reference numbers denote the same elements.

It is to be understood that description that an element or layer is "on", "adjacent to", "connected to", or "coupled to" another element or layer may refer to that the element or layer is directly on, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood, although various elements, components, regions, layers and/or parts may be described with terms first, second, third, etc., these elements, components, regions, layers and/or parts should not be limited by these terms. These terms are used only to distinguish one element, component, area, layer or part from another element, component, area, layer or part. Therefore, a first element, component, region, layer or part discussed below may be represented as a second element, component, region, layer or part without departing from the teaching of the disclosure. A second element, component, region, layer or part does not imply that a first element, component, region, layer or part is necessarily present in the disclosure.

Spatially relational terms such as "below", "under", "lower", "beneath", "above", and "upper" may be used herein for conveniently describing a relationship between one element or feature and another element or feature illustrated in the figures. It is to be understood that, in addition to the orientation shown in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may include otherwise orientation (rotation by 90 degrees or in other orientations) and the spatial descriptors used herein may be interpreted accordingly.

The terminology used herein is intended to describe the specific embodiments only and is not to be a limitation of the disclosure. As used herein, singular forms of "a", "an" and "said/the" are also intended to include the plural forms, unless the context clearly indicates otherwise. It should also be understood that the terms "including" and/or "comprising", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

Because size of units in semiconductor devices (such as DRAM, dynamic random access memory) is shrinking, DRAM with vertical transistor layout designed with 4F2 architecture has been introduced into the industry. In a DRAM with a vertical transistor layout, bit lines of vertical transistors are generally located at bottoms of semiconductor pillars. When the bit lines are formed at the bottoms of the semiconductor pillars, metal may be deposited in gaps between two adjacent ones of semiconductor pillars, and the metal and the substrate undergo silicidation reaction, thereby forming the bit lines of metal silicide at the bottoms of the semiconductor pillars. It is difficult to form high-quality and completely connected metal silicide by traditional preparation process of the bit lines of metal silicide.

Based on this, the embodiments of the disclosure provide a method for preparing a semiconductor structure. Referring to FIG. 1, the forming method includes the following operations.

In operation 101, a structure to be processed is provided. The structure includes a semiconductor substrate, a plurality of semiconductor fins extending along a first direction on the semiconductor substrate, and first filling layer which fills gaps between two adjacent ones of the semiconductor fins.

In operation 102, a first protective layer is formed on the structure to be processed, and the first protective layer is patterned.

In operation 103, the semiconductor fins and the first filling layer are etched along a second direction intersecting the first direction by taking the patterned first protective layer as a mask to etch the semiconductor fins into a plurality of semiconductor pillars and connecting ridges connecting two adjacent ones of the semiconductor pillars, in which the upper surface of the connecting ridge is higher than the upper surface of the first filling layer at both sides of the connecting ridge.

In the embodiments of the disclosure, after etching the semiconductor fins and the first filling layer, the upper surface of the connecting ridge is higher than the upper surface of the first filling layer at both sides of the connecting ridge, thereby exposing three surfaces of each of the connecting ridges, i.e., the sidewalls and the top. In a subsequent process of forming metal silicide, metal can react with the substrate not only from the top of the connecting ridge, but also from the sidewalls, which increases the contact area between the metal and the substrate, and makes it easier to form high-quality interconnected metal silicide. In addition, because three surfaces (the sidewalls and the top) of each of the connecting ridges are exposed at the same time, enough metal can participate in the reaction to form the metal silicide, and the problem of insufficient metal in the metal silicide reaction is solved.

Figure 2:
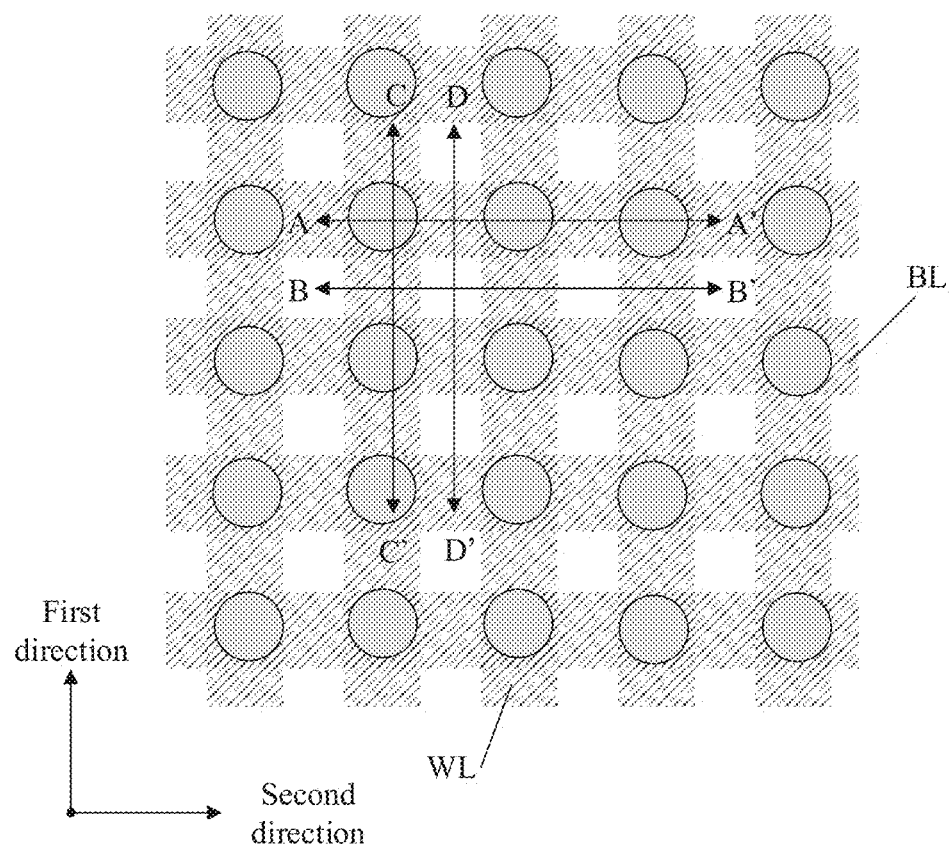
FIG. 2 is a top view scheme diagram of a semiconductor structure provided by embodiments of the disclosure.
Figure 3A:
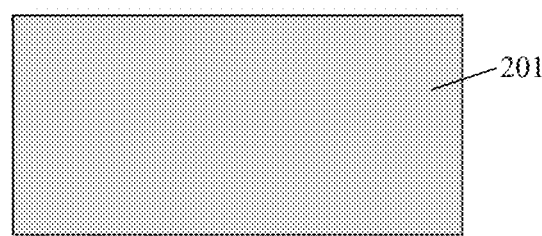
FIG. 3A is a cross-sectional structural scheme diagram taken along line AA' of FIG. 2 after an operation.
Figure 3B:
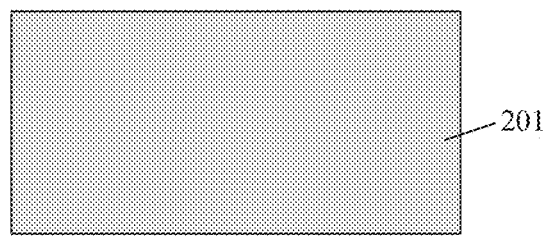
FIG. 3B is a cross-sectional structural scheme diagram taken along line BB' of FIG. 2 after an operation.
Figure 3C:
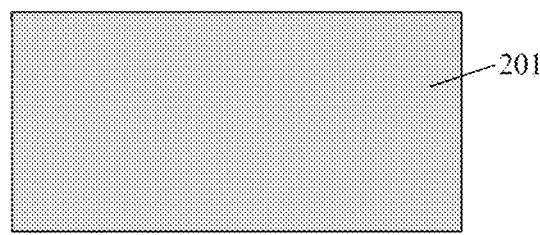
FIG. 3C is a cross-sectional structural scheme diagram taken along line CC' of FIG. 2 after each operation.
Figure 3D:
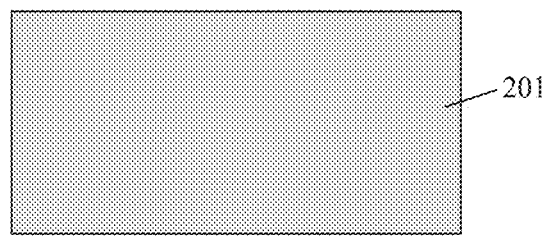
FIG. 3D is a cross-sectional structural scheme diagram taken along line DD' of FIG. 2 after an operation.
Figure 4A:
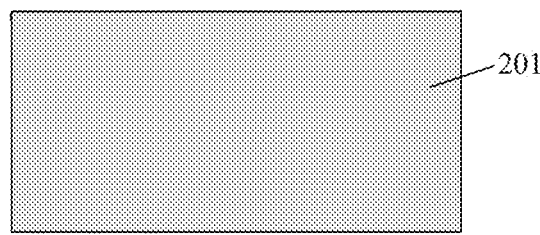
FIG. 4A is a cross-sectional structural scheme diagram taken along line AA' of FIG. 2 after an operation.
Figure 4B:
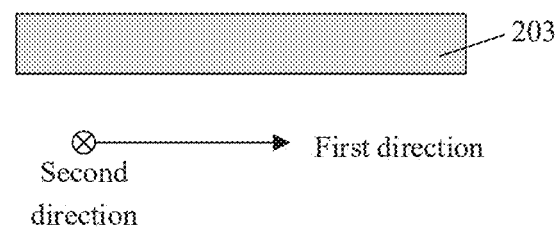
FIG. 4B is a cross-sectional structural scheme diagram taken along line BB' of FIG. 2 after an operation.
Figure 4C:
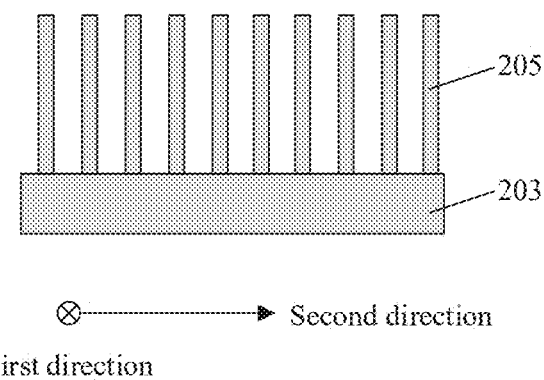
FIG. 4C is a cross-sectional structural scheme diagram taken along line CC' of FIG. 2 after each operation.
Figure 4D:
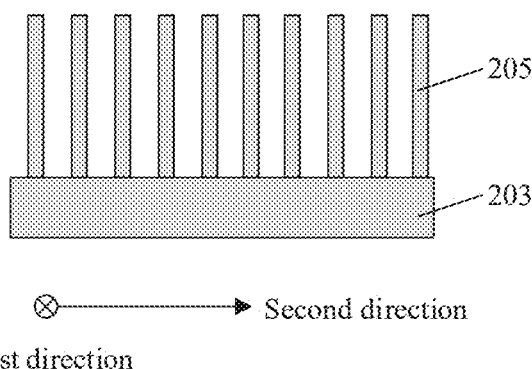
FIG. 4D is a cross-sectional structural scheme diagram taken along line DD' of FIG. 2 after an operation.
Figure 5A:
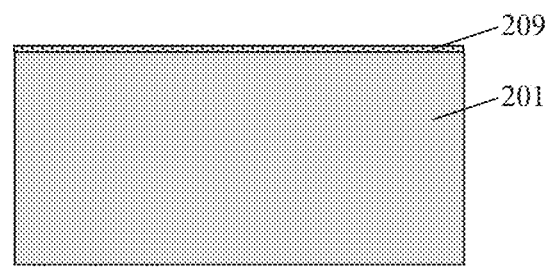
FIG. 5A is a cross-sectional structural scheme diagram taken along line AA' of FIG. 2 after an operation.
Figure 5B:
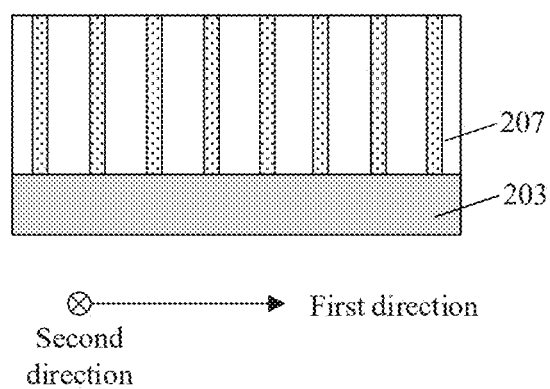
FIG. 5B is a cross-sectional structural scheme diagram taken along line BB' of FIG. 2 after an operation.
Figure 5C:
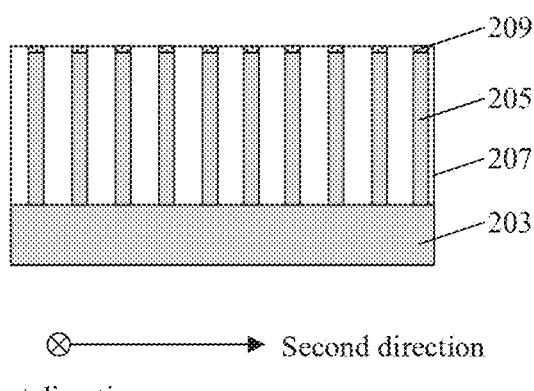
FIG. 5C is a cross-sectional structural scheme diagram taken along line CC' of FIG. 2 after each operation.
Figure 5D:
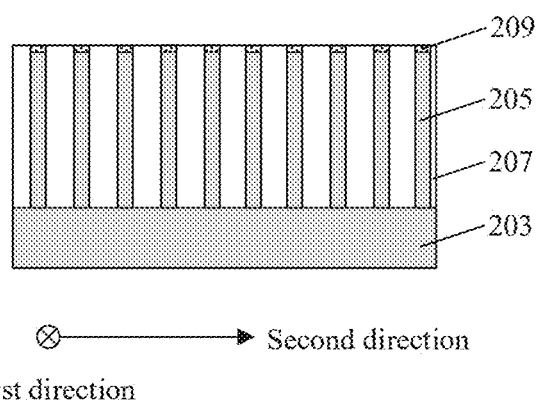
FIG. 5D is a cross-sectional structural scheme diagram taken along line DD' of FIG. 2 after an operation.
Figure 6A:
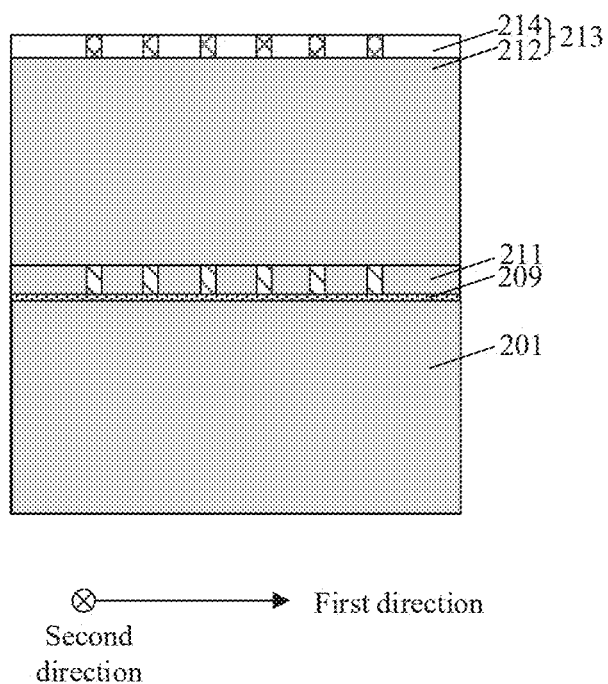
FIG. 6A is a cross-sectional structural scheme diagram taken along line AA' of FIG. 2 after an operation.
Figure 6B:
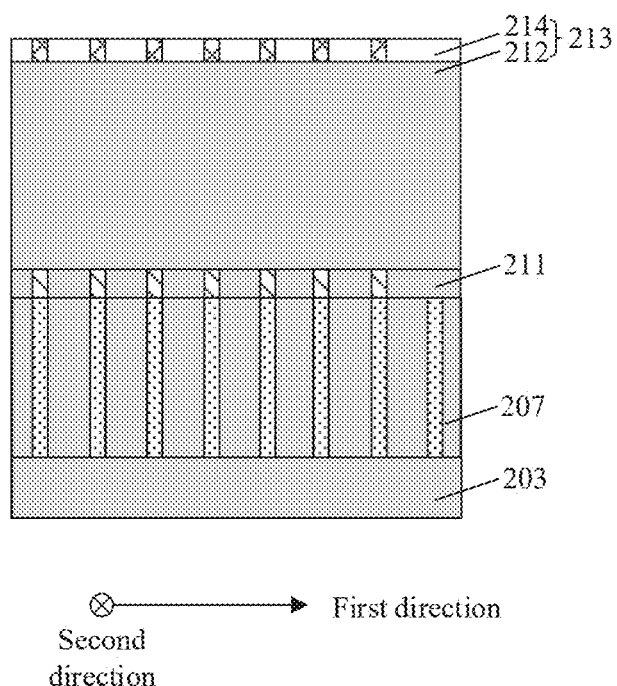
FIG. 6B is a cross-sectional structural scheme diagram taken along line BB' of FIG. 2 after an operation.
Figure 6C:
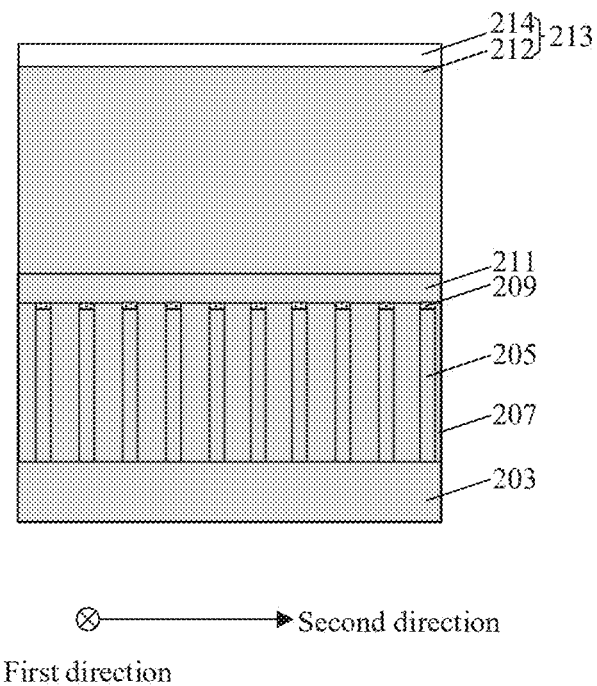
FIG. 6C is a cross-sectional structural scheme diagram taken along line CC' of FIG. 2 after each operation.
Figure 6D:
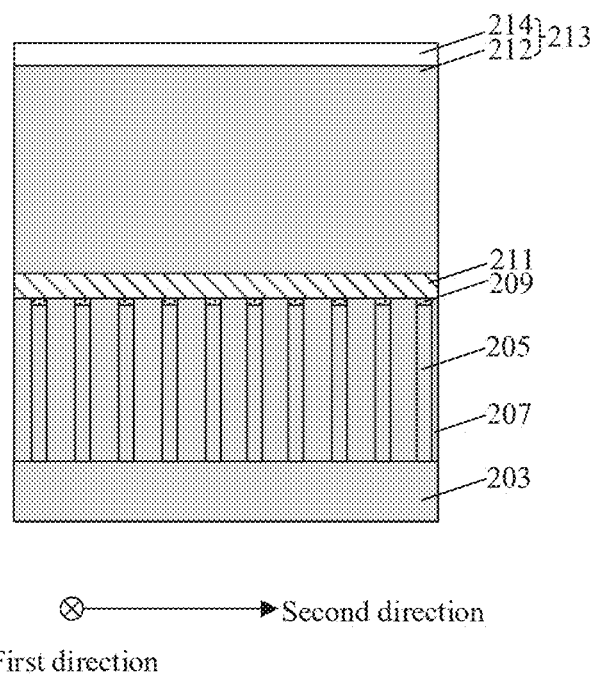
FIG. 6D is a cross-sectional structural scheme diagram taken along line DD' of FIG. 2 after an operation.
Figure 7A:
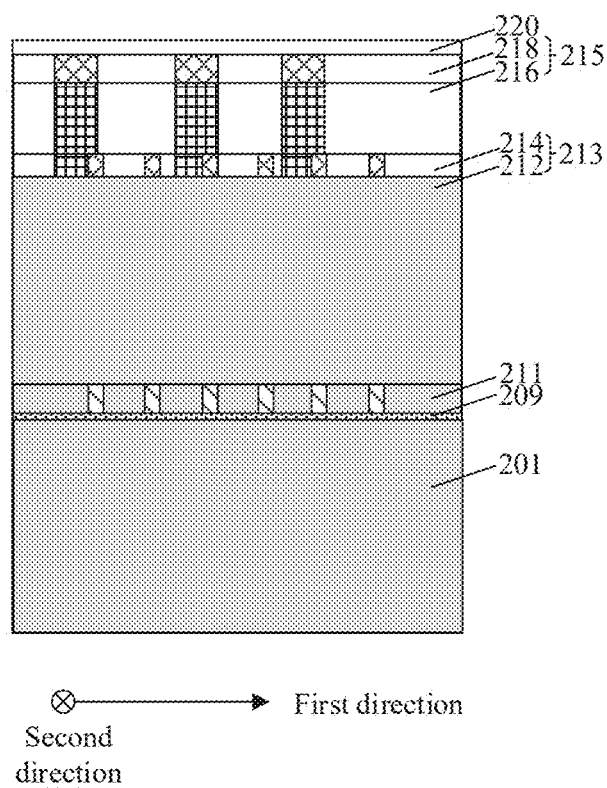
FIG. 7A is a cross-sectional structural scheme diagram taken along line AA' of FIG. 2 after an operation.
Figure 7B:
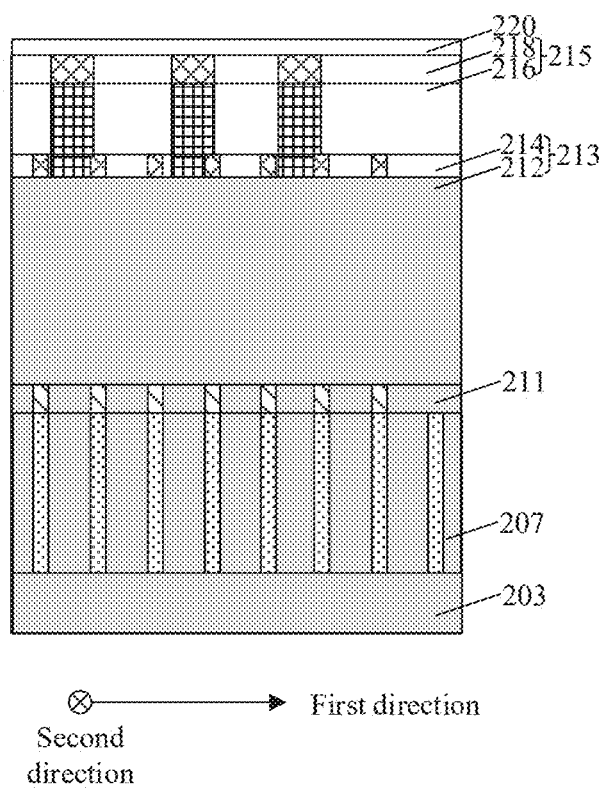
FIG. 7B is a cross-sectional structural scheme diagram taken along line BB' of FIG. 2 after an operation.
Figure 7C:
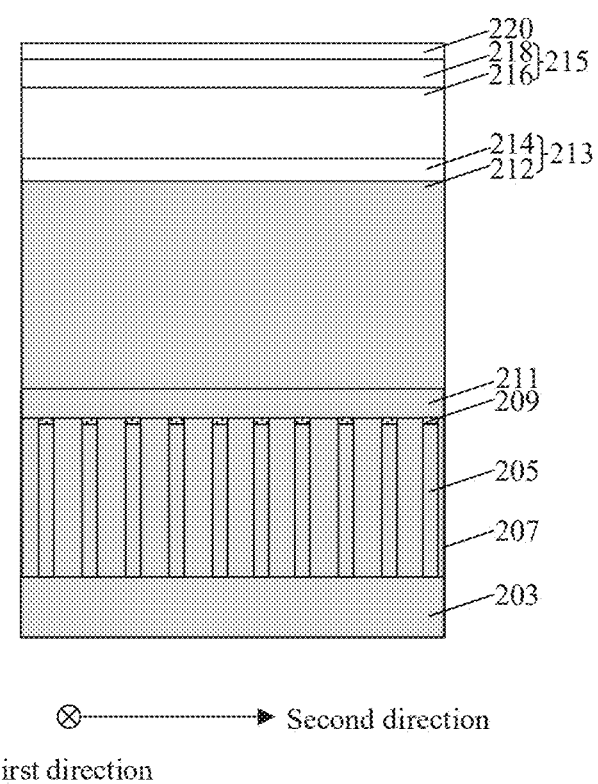
FIG. 7C is a cross-sectional structural scheme diagram taken along line CC' of FIG. 2 after each operation.
Figure 7D:
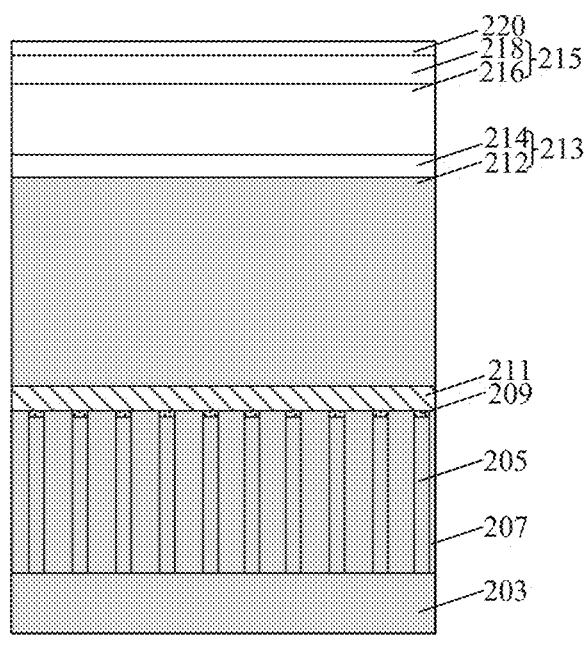
FIG. 7D is a cross-sectional structural scheme diagram taken along line DD' of FIG. 2 after an operation.
Figure 8A:
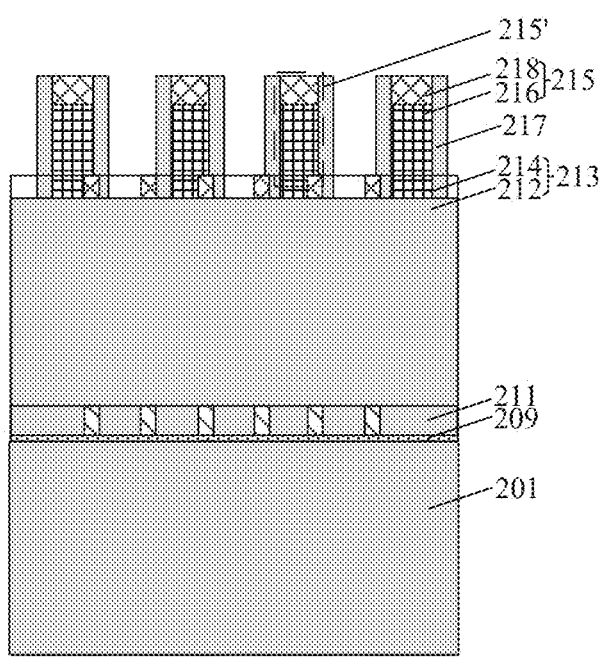
FIG. 8A is a cross-sectional structural scheme diagram taken along line AA' of FIG. 2 after an operation.
Figure 8B:
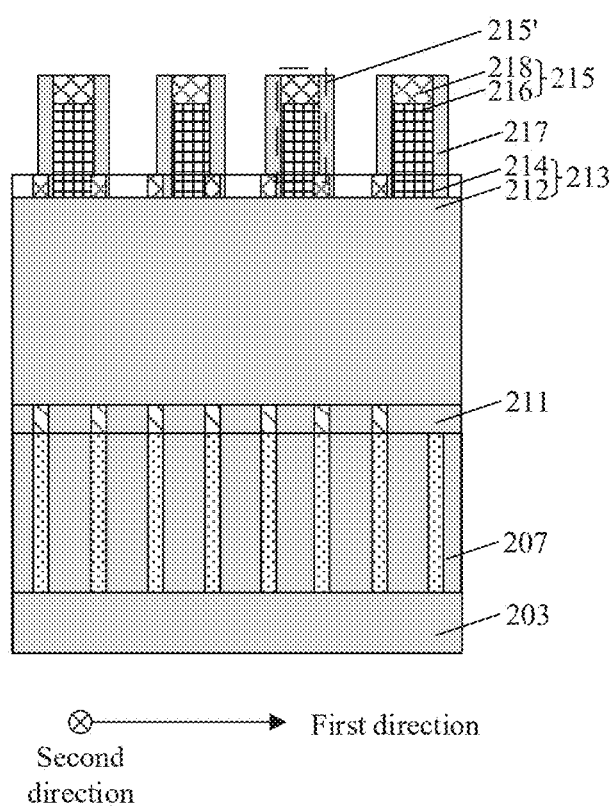
FIG. 8B is a cross-sectional structural scheme diagram taken along line BB' of FIG. 2 after an operation.
Figure 8C:
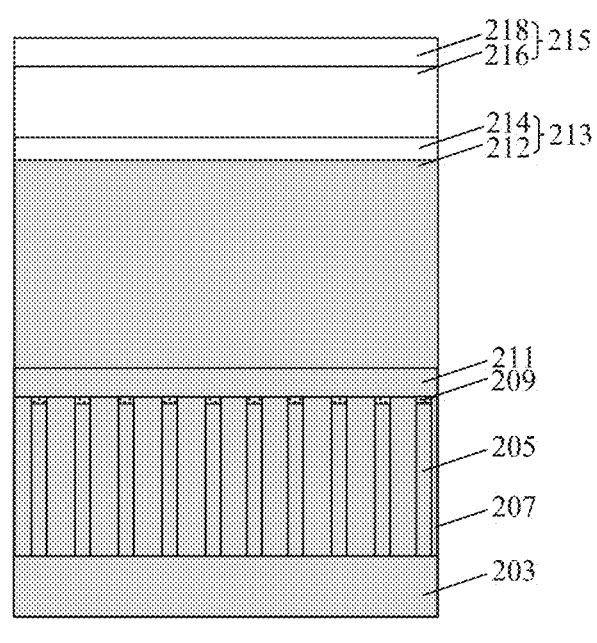
FIG. 8C is a cross-sectional structural scheme diagram taken along line CC' of FIG. 2 after each operation.
Figure 8D:
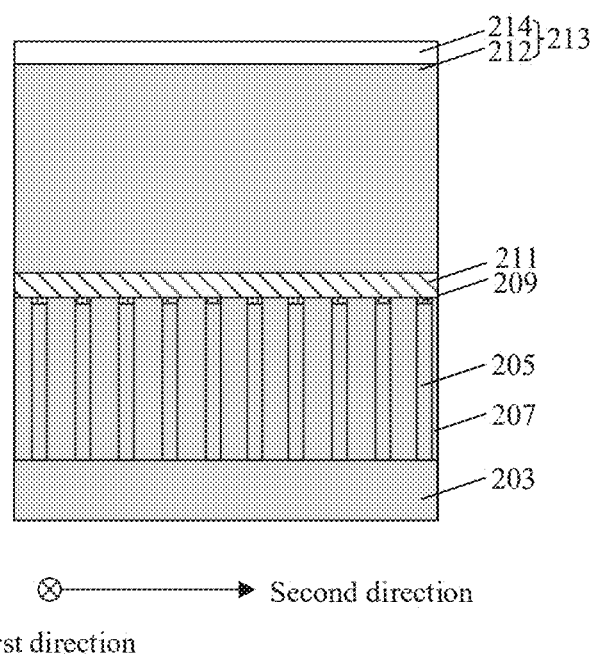
FIG. 8D is a cross-sectional structural scheme diagram taken along line DD' of FIG. 2 after an operation.
Figure 9A:
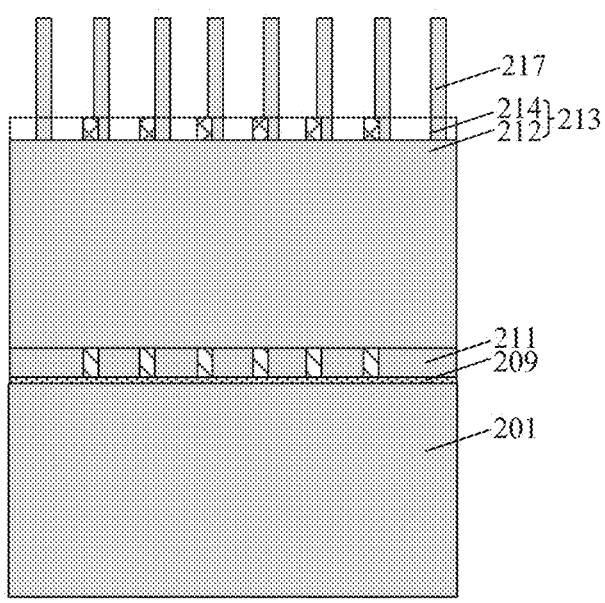
FIG. 9A is a cross-sectional structural scheme diagram taken along line AA' of FIG. 2 after an operation.
Figure 9B:
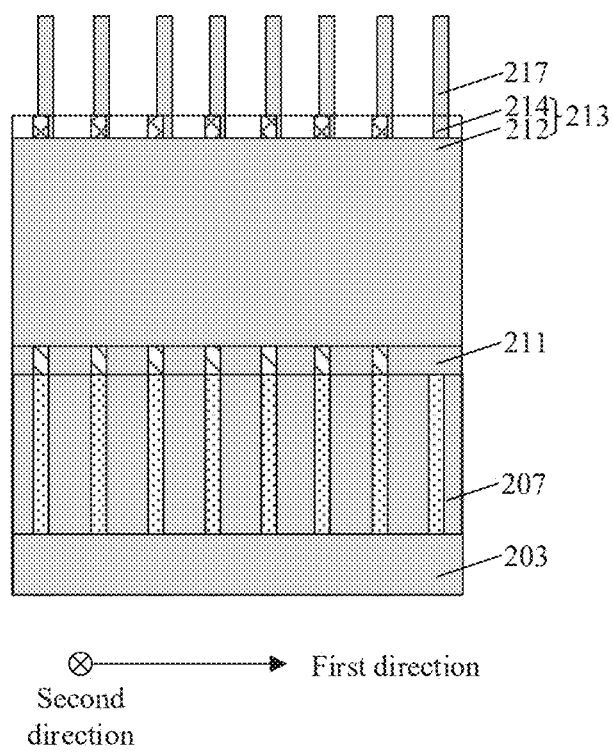
FIG. 9B is a cross-sectional structural scheme diagram taken along line BB' of FIG. 2 after an operation.
Figure 9C:
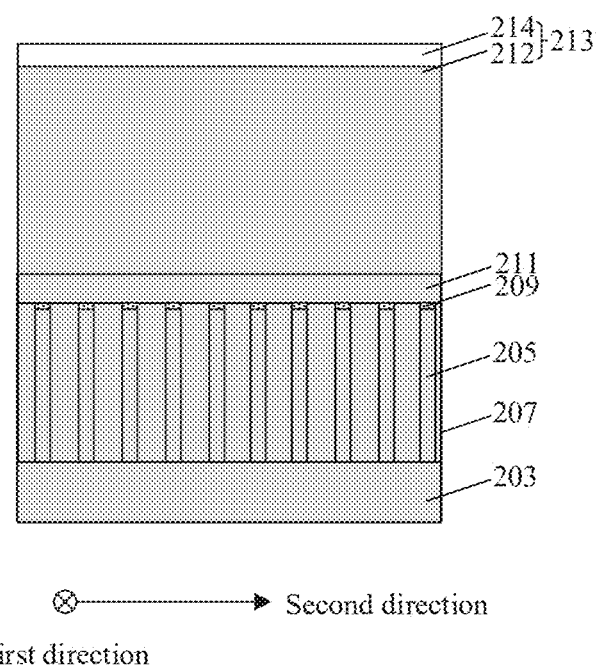
FIG. 9C is a cross-sectional structural scheme diagram taken along line CC' of FIG. 2 after each operation.
Figure 9D:
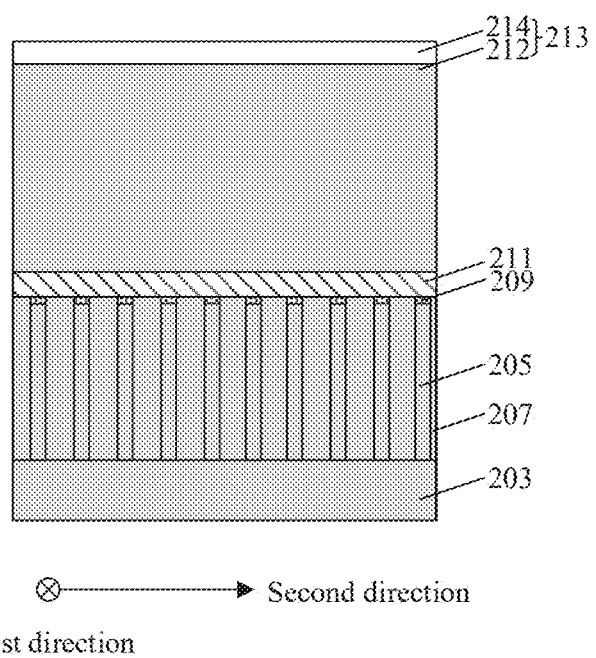
FIG. 9D is a cross-sectional structural scheme diagram taken along line DD' of FIG. 2 after an operation.
Figure 10A:
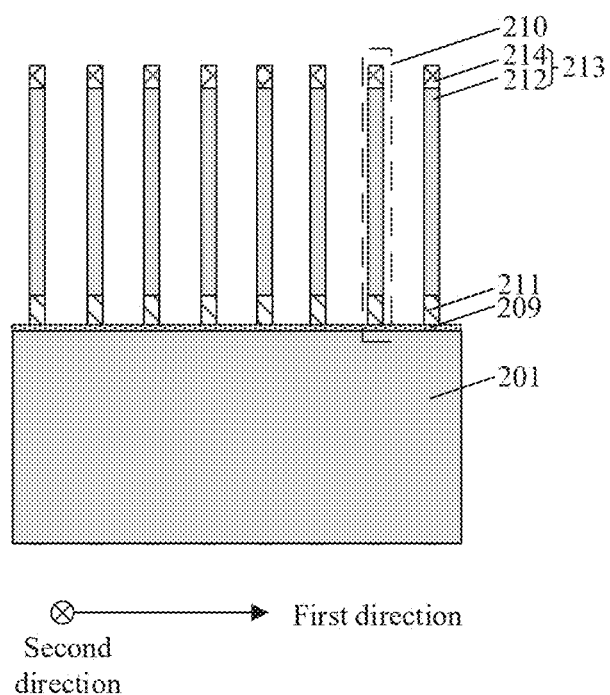
FIG. 10A is a cross-sectional structural scheme diagram taken along line AA' of FIG. 2 after an operation.
Figure 10B:
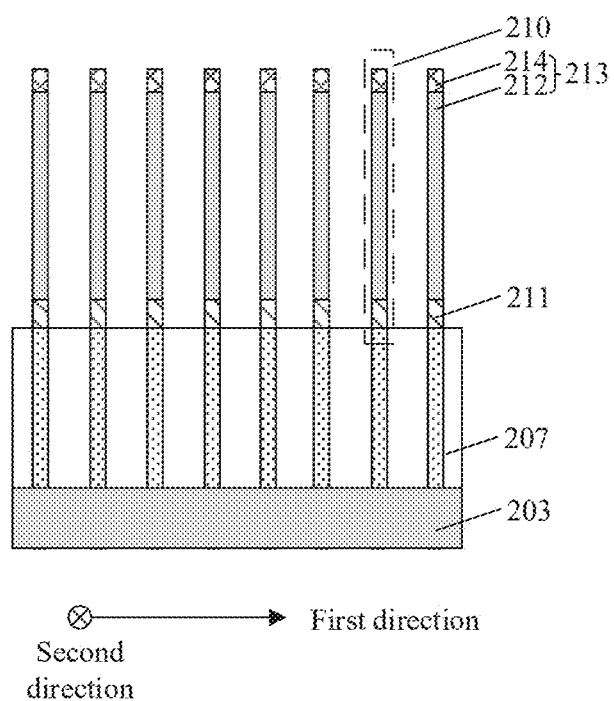
FIG. 10B is a cross-sectional structural scheme diagram taken along line BB' of FIG. 2 after an operation.
Figure 10C:
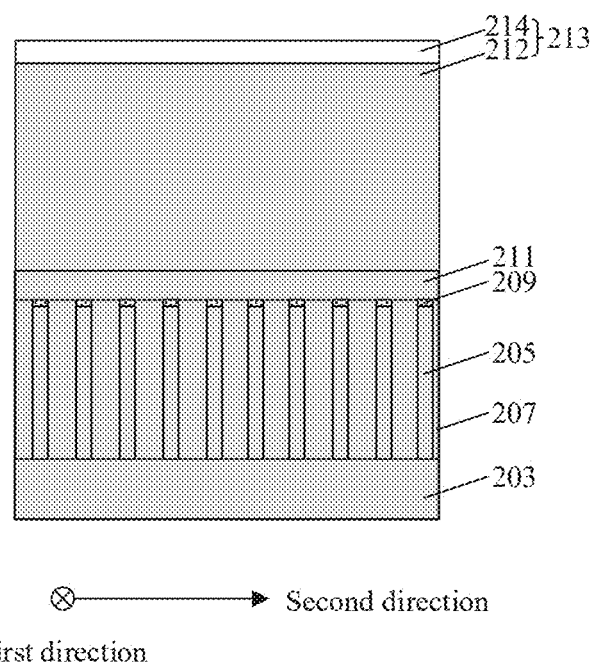
FIG. 10C is a cross-sectional structural scheme diagram taken along line CC' of FIG. 2 after each operation.
Figure 10D:
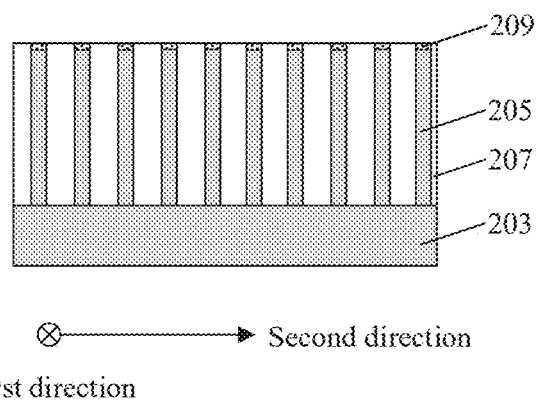
FIG. 10D is a cross-sectional structural scheme diagram taken along line DD' of FIG. 2 after an operation.
Figure 11A:
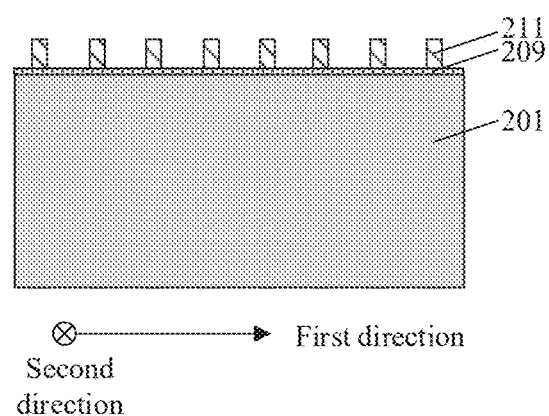
FIG. 11A is a cross-sectional structural scheme diagram taken along line AA' of FIG. 2 after an operation.
Figure 11B:
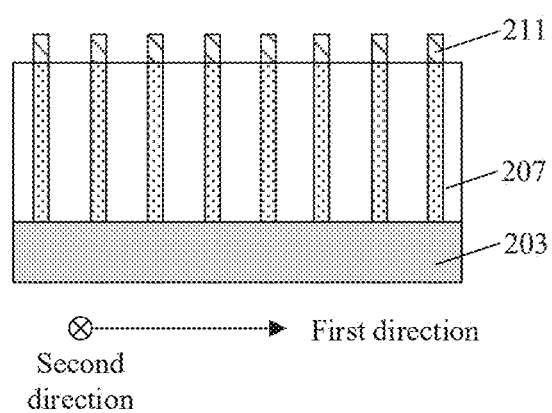
FIG. 11B is a cross-sectional structural scheme diagram taken along line BB' of FIG. 2 after an operation.
Figure 11C:
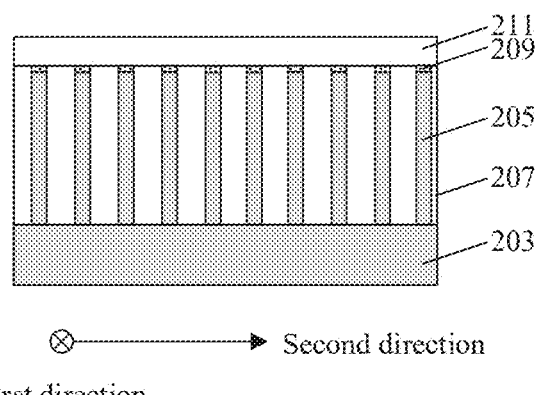
FIG. 11C is a cross-sectional structural scheme diagram taken along line CC' of FIG. 2 after each operation.
Figure 11D:
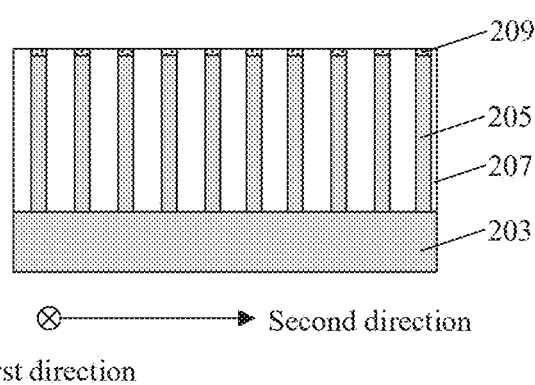
FIG. 11D is a cross-sectional structural scheme diagram taken along line DD' of FIG. 2 after an operation.
Figure 12A:
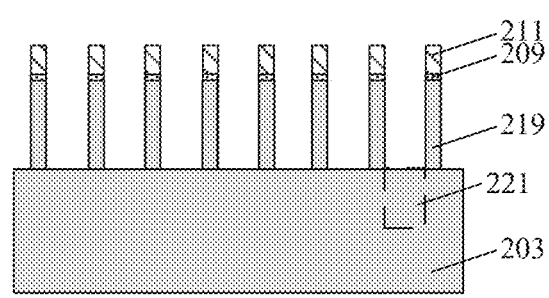
FIG. 12A is a cross-sectional structural scheme diagram taken along line AA' of FIG. 2 after an operation.
Figure 12B:
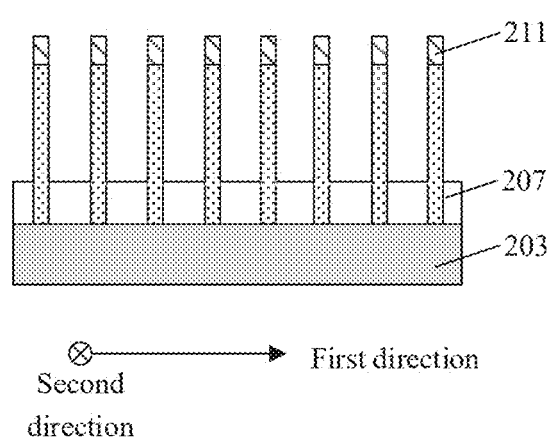
FIG. 12B is a cross-sectional structural scheme diagram taken along line BB' of FIG. 2 after an operation.
Figure 12C:
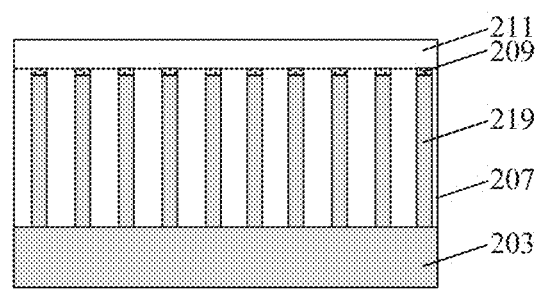
FIG. 12C is a cross-sectional structural scheme diagram taken along line CC' of FIG. 2 after each operation.
Figure 12D:
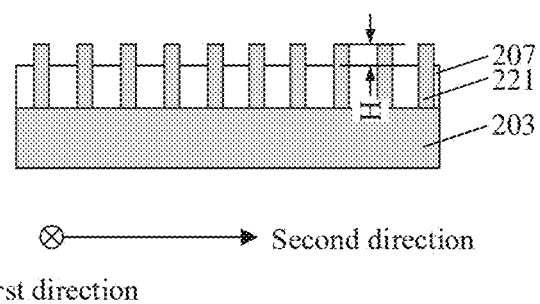
FIG. 12D is a cross-sectional structural scheme diagram taken along line DD' of FIG. 2 after an operation.
Figure 13A:
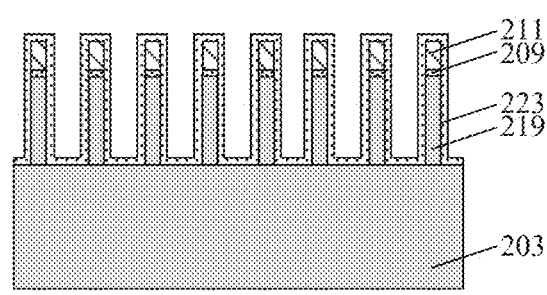
FIG. 13A is a cross-sectional structural scheme diagram taken along line AA' of FIG. 2 after an operation.
Figure 13B:
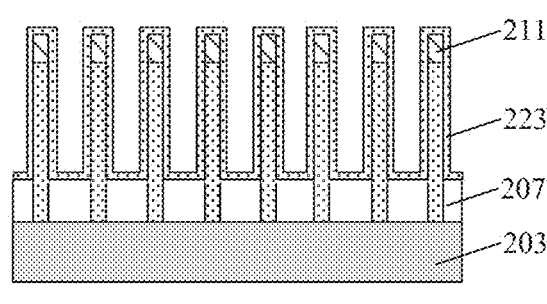
FIG. 13B is a cross-sectional structural scheme diagram taken along line BB' of FIG. 2 after an operation.
Figure 13C:
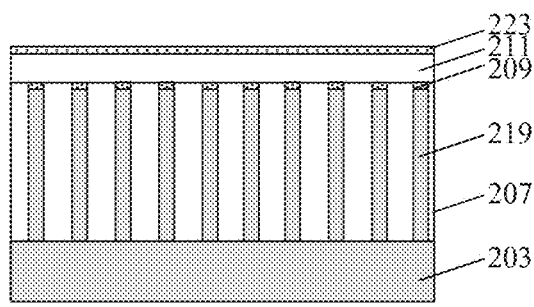
FIG. 13C is a cross-sectional structural scheme diagram taken along line CC' of FIG. 2 after each operation.
Figure 13D:
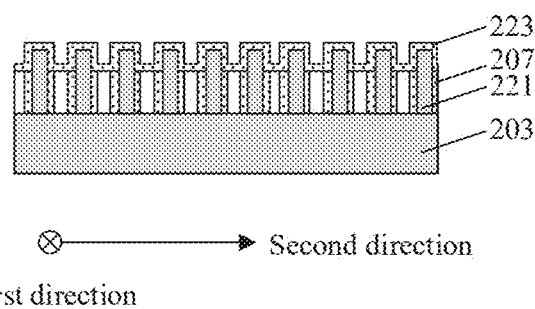
FIG. 13D is a cross-sectional structural scheme diagram taken along line DD' of FIG. 2 after an operation.
Figure 14A:
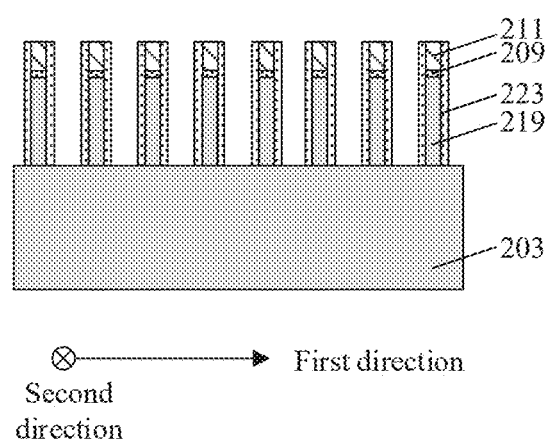
FIG. 14A is a cross-sectional structural scheme diagram taken along line AA' of FIG. 2 after an operation.
Figure 14B:
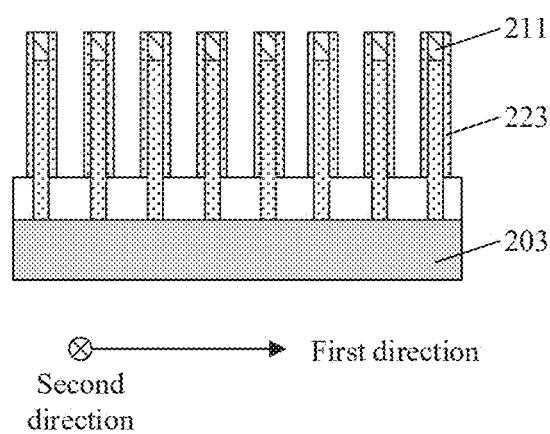
FIG. 14B is a cross-sectional structural scheme diagram taken along line BB' of FIG. 2 after an operation.
Figure 14C:
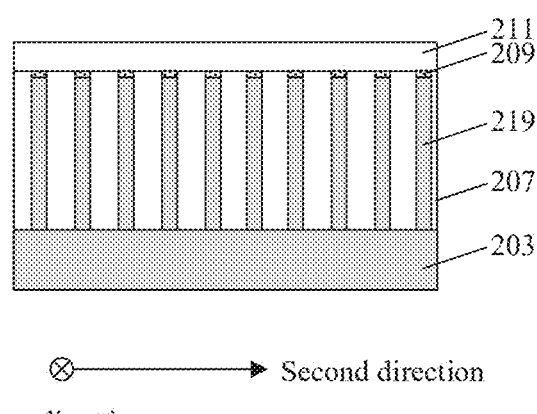
FIG. 14C is a cross-sectional structural scheme diagram taken along line CC' of FIG. 2 after each operation.
Figure 14D:
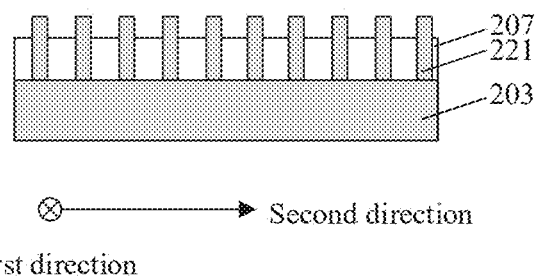
FIG. 14D is a cross-sectional structural scheme diagram taken along line DD' of FIG. 2 after an operation.
Figure 15A:
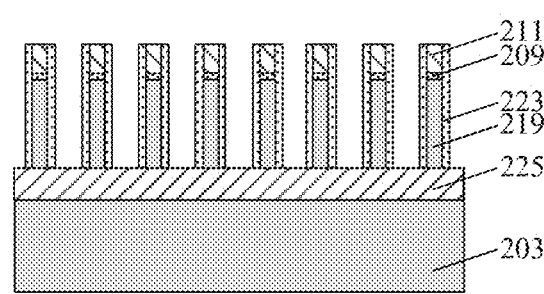
FIG. 15A is a cross-sectional structural scheme diagram taken along line AA' of FIG. 2 after an operation.
Figure 15B:
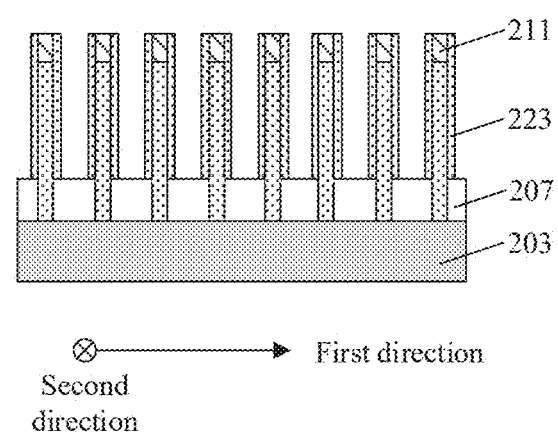
FIG. 15B is a cross-sectional structural scheme diagram taken along line BB' of FIG. 2 after an operation.
Figure 15C:
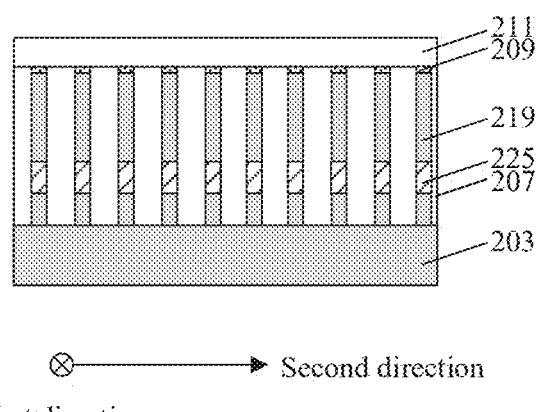
FIG. 15C is a cross-sectional structural scheme diagram taken along line CC' of FIG. 2 after each operation.
Figure 15D:
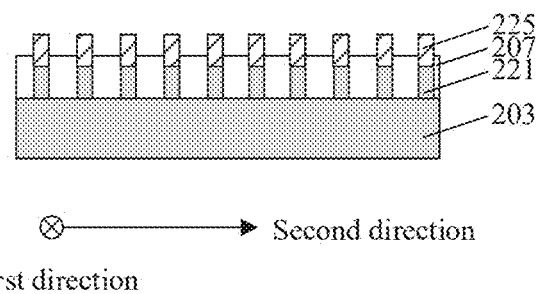
FIG. 15D is a cross-sectional structural scheme diagram taken along line DD' of FIG. 2 after an operation.
Figure 16A:
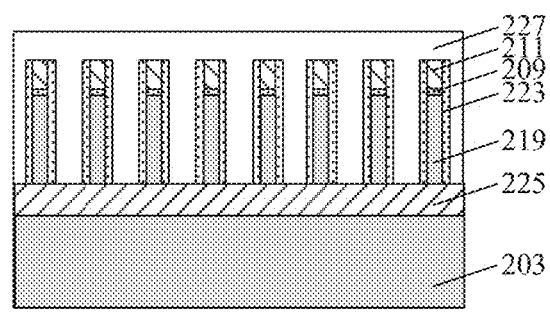
FIG. 16A is a cross-sectional structural scheme diagram taken along line AA' of FIG. 2 after an operation.
Figure 16B:
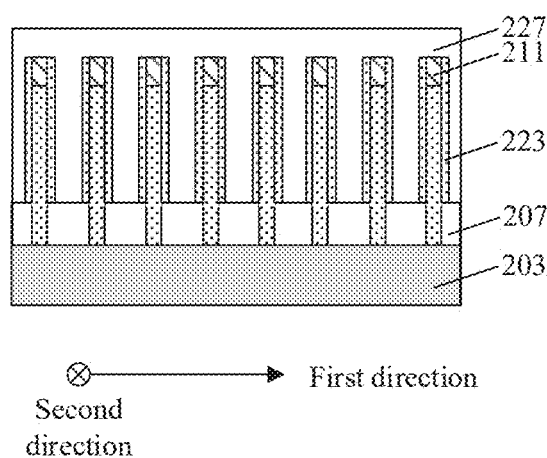
FIG. 16B is a cross-sectional structural scheme diagram taken along line BB' of FIG. 2 after an operation.
Figure 16C:
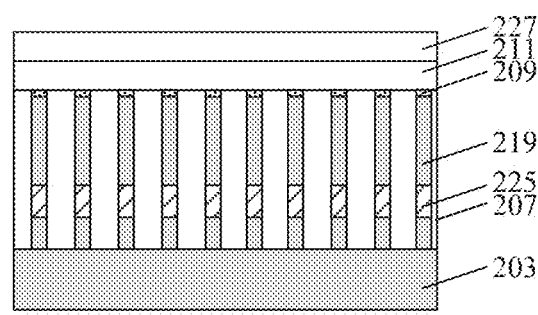
FIG. 16C is a cross-sectional structural scheme diagram taken along line CC' of FIG. 2 after each operation.
Figure 16D:
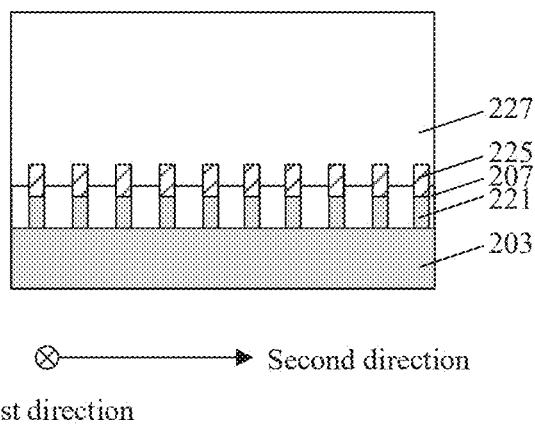
FIG. 16D is a cross-sectional structural scheme diagram taken along line DD' of FIG. 2 after an operation.
Figure 17A:
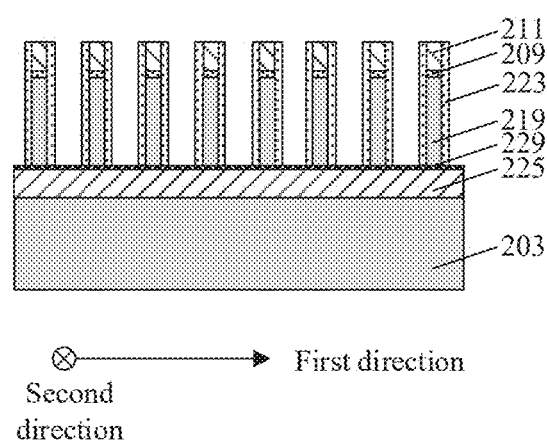
FIG. 17A is a cross-sectional structural scheme diagram taken along line AA' of FIG. 2 after an operation.
Figure 17B:
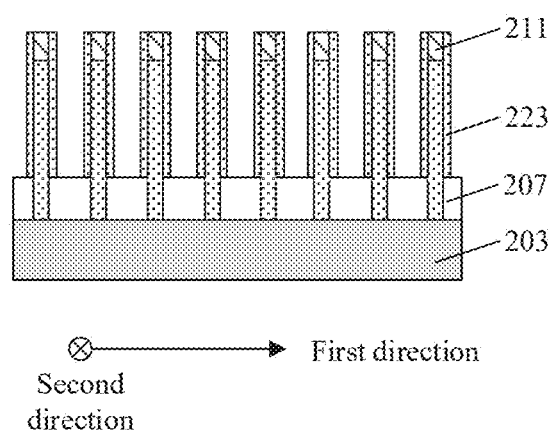
FIG. 17B is a cross-sectional structural scheme diagram taken along line BB' of FIG. 2 after an operation.
Figure 17C:
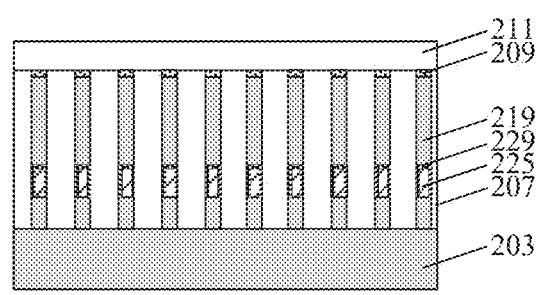
FIG. 17C is a cross-sectional structural scheme diagram taken along line CC' of FIG. 2 after each operation.
Figure 17D:
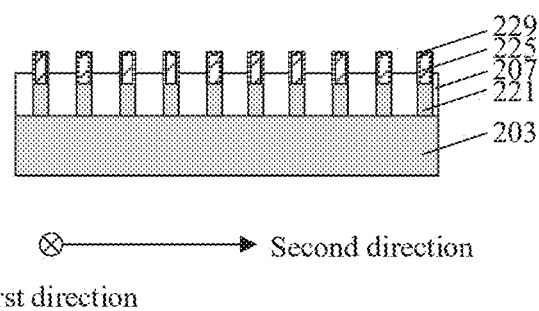
FIG. 17D is a cross-sectional structural scheme diagram taken along line DD' of FIG. 2 after an operation.
Figure 18A:
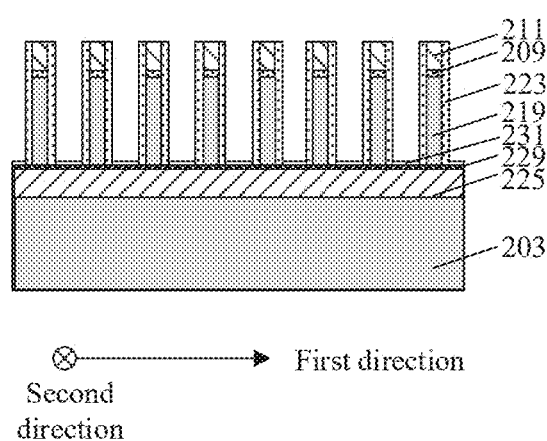
FIG. 18A is a cross-sectional structural scheme diagram taken along line AA' of FIG. 2 after an operation.
Figure 18B:
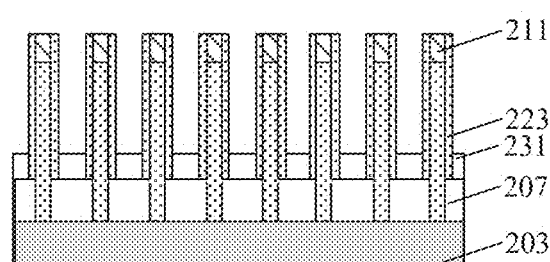
FIG. 18B is a cross-sectional structural scheme diagram taken along line BB' of FIG. 2 after an operation.
Figure 18C:
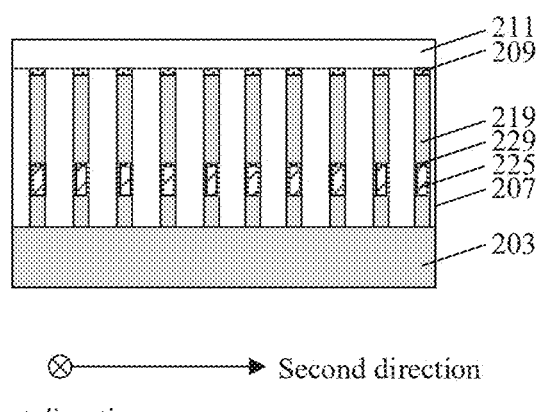
FIG. 18C is a cross-sectional structural scheme diagram taken along line CC' of FIG. 2 after each operation.
Figure 18D:
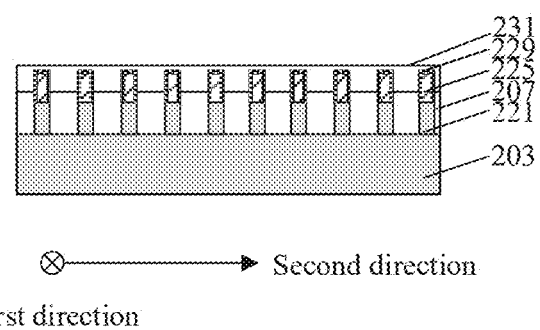
FIG. 18D is a cross-sectional structural scheme diagram taken along line DD' of FIG. 2 after an operation.

FIG. 2 is a top view scheme diagram of a semiconductor structure provided by embodiments of the disclosure; FIGS. 3A-18A are cross-sectional structural scheme diagrams taken along line AA' of FIG. 2 after each operation, FIGS. 3B-18B are cross-sectional structural scheme diagrams taken along line BB' of FIG. 2 after each operation, FIGS. 3C-18C are cross-sectional structural scheme diagrams taken along line CC' of FIG. 2 after each operation, and FIGS. 3D-18D are cross-sectional structural scheme diagrams taken along line DD' of FIG. 2 after each operation. The manufacturing method of the semiconductor structure provided by the embodiments of the disclosure will be described further in detail below with reference to the accompanying drawings. In detailing the embodiment of the disclosure, for the sake of illustration, scheme diagrams will not be partially enlarged in accordance with the normal scale. The scheme diagrams are only exemplary, and should not limit the scope of protection of the disclosure here.

First, as shown in FIGS. 3A-3D, 4A-4D, and 5A-5D, operation 101 is performed to provide a structure to be processed. The structure to be processed includes a semiconductor substrate 203, a plurality of semiconductor fins 205 extending along a first direction on the semiconductor substrate 203, and first filling layer 207 filling gaps between two adjacent ones of the semiconductor fins 205.

The semiconductor substrate 203 and the semiconductor fins 205 may include at least one elemental semiconductor material, at least one III-V compound semiconductor material, at least one II-VI compound semiconductor material, at least one organic semiconductor material, or other semiconductor materials known in the art. In a particular embodiment, a semiconductor substrate is a silicon substrate, which may or may not be doped. A material of the semiconductor fin 205 may be the same as that of the semiconductor substrate 203. A material of the first filling layer 207 includes but is not limited to an oxide, such as silicon oxide.

In some embodiments, as shown in FIGS. 3A-3D, 4A-4D, and 5A-5D, the operation that a structure to be processed is provided includes the following operations. A semiconductor base 201 is provided. An upper portion of the semiconductor base 201 is etched along the first direction to form a plurality of semiconductor fins 205 extending along the first direction, and a lower portion of the semiconductor base 201 that is not etched becomes a semiconductor substrate 203. The gaps between two adjacent ones of the semiconductor fins 205 are filled with a first filling layer 207, and an upper surface of the first filling layer 207 is flush with upper surfaces of the semiconductor fins 205. The semiconductor fins 205 are thermally oxidized, and a thermal oxide layer 209 is formed on the upper surfaces of the semiconductor fins 205.

Specifically, as shown in FIGS. 3A-3D, first, the semiconductor base 201 is provided. The semiconductor base may include at least one elemental semiconductor material (e.g. a silicon (Si) base, a germanium (Ge) base), at least one III-V compound semiconductor material, at least one II-VI compound semiconductor material, at least one organic semiconductor material, or other semiconductor materials known in the art.

Next, as shown in FIGS. 4A-4D, the upper portion of the semiconductor base 201 is etched along the first direction to form the plurality of semiconductor fins 205 extending along the first direction, and the lower portion of the semiconductor base 201 that is not etched becomes the semiconductor substrate 203. Here, the upper portion of the semiconductor base may be etched by a dry etching process including physical etching, chemical etching, reactive ion etching, and the like.

Next, as shown in FIGS. 5A-5D, the gaps between two adjacent ones of the semiconductor fins 205 is filled with the first filling layer 207, the upper surface of the first filling layer is flush with the upper surfaces of the semiconductor fins 205, the semiconductor fins 205 are thermally oxidized, and the thermal oxide layer 209 is formed on the upper surfaces of the semiconductor fins 205. The first filling layer 207 may fill the gaps between two adjacent ones of the semiconductor fins 205 by atomic layer deposition (ALD), chemical vapor deposition (CVD) or the like. Alternatively, after filling the gaps between two adjacent ones of the semiconductor fins 205 with the first filling layer 207, a planarization process, such as chemical mechanical grinding (CMP) and/or an etching process, may be employed, to make the upper surface of the first filling layer 207 coplanar with the upper surfaces of the semiconductor fins 205. The thermal oxide layer, which may for example be silicon oxide, may be formed by an in-situ thermal oxidation treatment on the semiconductor fins 205, and the thermal oxide layer can protect the semiconductor pillars during subsequent processes.

In an embodiment, after forming the plurality of semiconductor fins 205 extending along the first direction, the method further includes: performing ion implantation on the semiconductor fins 205 to form first source/drain doped regions (not shown) and second source/drain doped regions (not shown) at a top and a bottom of each semiconductor fin 205, respectively. In other embodiments, after the semiconductor base 201 is provided, ion implantation may be performed on the semiconductor base 201 to form first doped regions and second doped regions. Once the plurality of semiconductor fins extending along the first direction are subsequently formed, the first doped regions are used for forming first source/drain doped regions and the second doped regions are used for forming second source/drain doped regions.

Next, referring to FIGS. 6A-6D, 7A-7D, 8A-8D, 9A-9D, 10A-10d and 11A~11d, operation 102 is performed. A first protective layer 211 is formed on the structure to be processed, and the first protective layer 211 is patterned. A material of the first protective layer 211 includes but is not limited to nitrides, such as silicon nitride. In practice, the first protective layer 211 may be formed on the structure to be processed by atomic layer deposition (ALD), chemical vapor deposition (CVD) or the like. The patterning process includes, but is not limited to, a self-aligned double patterning process (SADP) and a self-aligned quadruple patterning process (SAQP). By providing the first protective layer above the structure to be processed, the semiconductor pillars formed subsequently can be effectively protected from oxidation, nitridation, damage or pollution in subsequent processes.

In some embodiments, referring to FIGS. 6A-6D, 7A-7D, 8A-8D, 9A-9D, 10A-10D, and 11A-11D, the operation that the first protective layer 211 is patterned includes the following operations. A first mask layer 213 is formed on the first protective layer 211. The first mask layer 213 and the first protective layer 211 are etched to pattern the first mask layer 213 and the first protective layer 211 into a plurality of strip structures 210 extending along a second direction. The first mask layer 213 is removed.

In some embodiments, referring to FIGS. 7A-7D, 8A-8D, 9A-9D and 10A-10D, the operation that the first mask layer 213 and the first protective layer 211 are etched includes the following operations. A second mask layer 215 is formed on the first mask layer 213. The second mask layer 215 is patterned to form a plurality of initial strip structures 215' extending along the second direction. Spacers 217 having vertical sidewall morphology are formed on sidewalls of the initial strip structures 215'. The initial strip structures 215' are removed, and the first mask layer 213 and the first protective layer 211 are etched by taking the spacers 217 as a mask.

Specifically, referring to FIGS. 6A-6D, first, a first mask layer 213 is formed above the first protective layer 211. In practice, the first mask layer 213 may include a bottom first mask layer 212 and a top first mask layer 214 which are stacked, and the top first mask layer 214 is above the bottom first mask layer 212. The bottom first mask layer may include but not limited to polysilicon or amorphous carbon, and the top first mask layer may include but not limited to silicon oxynitride. A mask layer with multi-layer structure can improve line width consistency and edge roughness.

Next, referring to FIGS. 7A-7D, the second mask layer 215 is formed above the first mask layer 213. In practice, the second mask layer 215 may include a bottom second mask layer 216 and a top second mask layer 218 which are stacked, and the top second mask layer 218 is above the bottom second mask layer 216. The bottom second mask layer 216 may include but is not limited to a hard mask material, and the top second mask layer 218 may include but is not limited to silicon oxynitride. A mask layer with multi-layer structure can improve line width consistency and edge roughness.

Next, referring to FIGS. 8A-8D, the second mask layer 215 is patterned to form the plurality of initial strip structures 215' extending along the second direction, and the spacers 217 having vertical sidewall morphology are formed on the sidewalls of the initial strip structures 215'. In some embodiments, the operation that the second mask layer 215 is patterned to form the plurality of initial strip structures 215' extending along the second direction includes the following operations. A photoresist layer 220 is formed on the second mask layer 215 (see FIGS. 7A-7D). The photoresist layer is patterned and the second mask layer 215 is etched by taking the patterned photoresist layer as a mask. In practice, the photoresist layer 220 may also include a Si-containing anti-reflection coating (SiARC) which covers a surface of the second mask layer 215. By doing so, the reflected light of lithography can be absorbed, and the linewidth resolution in a lithography process can be improved. In some embodiments, the plurality of initial strip structures 215' are arranged at an equal interval in parallel, and heights and widths of the plurality of initial strip structures may be the same. A width of the spacer may be, but is not limited to, half the width of the initial strip structure. A material of the spacers 217 may include, but is not limited to, oxide. In practice, a spacer layer covering surfaces of the initial strip structures may be formed. Part of the spacer layer covering the surface of the first mask layer and the tops of the initial strip structures is removed, and part of the spacer layer on sidewalls of the initial strip structures are retained, and the spacers having vertical sidewall morphology are therefore formed.

Next, referring to FIGS. 9A-9D, the initial strip structures 215' are removed. The initial strip structure 215' may be removed by wet etching, dry etching or a combination thereof.

Next, referring to FIGS. 10A-10D, the first mask layer 213 and the first protective layer 211 are etched by taking the spacers 217 as a mask, and the first mask layer 213 and the first protective layer 211 are patterned into a plurality of strip structures 210 extending along the second direction. The first mask layer 213 and the first protective layer 211 may be patterned by wet etching and dry etching. In some embodiments, the plurality of strip structures 210 are arranged at an equal interval in parallel, and heights and widths of the plurality of strip structures may be the same. The width of the strip structures 210 may be half the width of the initial strip structures, but is not limited to. By doing so, a linewidth of the spacer is effectively reduced, a spatial density of the pattern is multiplied, a density of semiconductor pillars formed subsequently can be increased, a finer and more accurate pattern is formed, and registration accuracy is improved.

Next, referring to FIGS. 11A-11D, the first mask layer 213 is removed. The first mask layer 213 may be removed by wet etching, dry etching or a combination thereof.

Next, operation 103 is performed. Referring to FIGS. 12A-12D, the semiconductor fins 205 and the first filling layer 207 are etched along the second direction intersecting the first direction by taken the patterned first protective layer 211 a mask, to etch the semiconductor fins 205 into a plurality of semiconductor pillars 219 and connecting ridges 221 connecting two adjacent ones of the semiconductor pillars, in which the upper surface of the connecting ridge 221 is higher than the upper surface of the first filling layer 207 at both sides of the connecting ridge 221.

In some specific embodiments, the operation that the semiconductor fins 205 and the first filling layer 207 along a second direction intersecting the first direction by taking the patterned first protective layer 211 as a mask, to etch the semiconductor fins 205 into a plurality of semiconductor pillars 219 and connecting ridges 221 connecting two adjacent ones of the semiconductor pillars, in which the upper surface of the connecting ridge 221 is higher than the upper surface of the first filling layer 207 at both sides of the connecting ridge includes the following operations. An etching selection ratio between the semiconductor fins 205 and the first filling layer 207 is controlled to make an etching rate of the first filling layer 207 is greater than that of the semiconductor fins 205, so that a height difference H between the upper surface of the connecting ridge 221 and the upper surfaces of the first filling layer 207 at both sides of the connecting ridge 221 after etching is 20-30 nm. For example, the height difference H between the upper surface of the connecting ridge 221 and the upper surface of the first filling layer 207 at both sides of the connecting ridge 221 may be, for example, 21 nm, 25 nm or 28 nm. By utilizing the different etching rates of the first filling layer 207 and the semiconductor fins 205 during etching, the upper surface of the connecting ridge higher than the upper surface of the filling layer at both sides of the connecting ridge can be provided in one operation with high efficiency. When the height difference is too large, there will be difficulties in a subsequent filling process. When the height difference is too small, exposed areas of the sidewalls of the connecting ridges are too small, which is not conducive to forming high-quality interconnected metal silicide subsequently.

In some embodiments, the operation that the semiconductor fins 205 and the first filling layer 207 are etched along a second direction intersecting the first direction to etch the semiconductor fins 205 into a plurality of semiconductor pillars 219 and connecting ridges 221 connecting two adjacent ones of the semiconductor pillars, in which the upper surface of the connecting ridge is higher than the upper surface of the first filling layer at both sides of the connecting ridge, includes the following operations. Etching conditions are controlled to make the height difference between the upper surface of the connecting ridge 221 and the upper surface of the first filling layer 207 at both sides of the connecting ridge 221 reach 0.5-1 times of the thickness of the first protective layer 211. For example, the height difference between the upper surface of the connecting ridge 221 and the upper surface of the first filling layer 207 at both sides of the connecting ridge 221 may for example be 0.7, 0.8 or 0.9 times as the thickness of the first protective layer 211. When the fold is too large, it is difficult to control the height difference between the connecting ridge and the filling layer at both sides of the connecting ridge. When the fold is too small, inefficiency is leaded and a limitation of the thickness of the first protective lays is not conducive to achieving a desired height difference.

In some embodiments, referring to FIGS. 13A-13D and FIGS. 14A-14D, after etching the semiconductor fins 205 and the first filling layer 207 along the second direction, the method further includes the following operations. A second protective layer 223 is formed, which covers at least sidewalls of the semiconductor pillars 219 and the tops and sidewalls of the connecting ridges 221. The second protective layer 223 covering the tops and sidewalls of the connecting ridges 221 is removed to expose the tops and sidewalls of the connecting ridges 221. A material of the second protective layer 223 may be an oxide, in particular silicon oxide. The second protective layer can effectively protect the sidewalls of the semiconductor pillars, and avoid an influence of subsequent ion implantation and silicification reaction between metal and substrate on the semiconductor pillars.

In practice, the second protective layer 223 may be formed by atomic layer deposition (ALD), chemical vapor deposition (CVD), or the like to cover the surface of the first filling layer 207, the semiconductor pillars 219, and the tops and sidewalls of the connecting ridges 221. A back etching process may be employed to remove the second protective layer 223 covering the tops of the semiconductor pillars 219, the surface of the first filling layer 207, and the tops and sidewalls of the connecting ridges 221.

In some embodiments, as shown in FIGS. 15A-15D, after removing the second protective layer 223 covering the tops and sidewalls of the connecting ridges 221, the method further includes the following operations. Ion implantation is performed to form doped regions 225 at the exposed tops and sidewalls of the connecting ridges 221 and lower portions of the semiconductor pillars 219. The doped regions 225 formed at the tops and sidewalls of the connecting ridges 221 and the lower portions of the semiconductor pillars are connected and extend along the first direction. In other embodiments, the doped regions 225 may also be formed by a diffusion process.

In some embodiments, as shown in FIGS. 16A-16D and FIGS. 17A-17D, after the ion implantation, the method further includes the following operations. A metal layer 227 covering the exposed tops and sidewalls of the doped regions 225 is deposited. A heat treatment is performed, such that the metal layer 227 reacts with the doped regions 225 to form metal silicide at the tops and sidewalls of the doped regions 225. The metal silicide extends along the first direction and serves as bit lines 229 in the semiconductor structure. The unreacted metal layer is removed. The metal layer includes, but is not limited to, cobalt, titanium or nickel. The metal silicide includes, but is not limited to, cobalt silicide, titanium silicide or nickel silicide. In practice, a temperature of the heat treatment may be 600-700° C., for example, 630° C., 670° C. or 690° C., in consideration of energy consumption and yield. Metal silicide can effectively reduce contact resistance and improve signal transmission rate of the bit lines. In the embodiments of the disclosure, the metal can react with the substrate not only from the tops of the connecting ridges, but also from the sidewalls of the connecting ridges, which increases contact areas between the metal and the substrate and makes it easier to form high-quality interconnected metal silicide. In addition, because the sidewalls and the top of each the connecting ridges, three surfaces, are exposed at the same time, enough metal can participate in the reaction to form the metal silicide, and the problem of insufficient metal in the metal silicide reaction is solved.

In some embodiments, as shown in FIGS. 18A-18D, after removing the unreacted metal layer, the method further includes the following operation. Second filling layer 231 is formed. The second filling layer fills gaps between two adjacent ones of the bit lines 229 and covers the tops and sidewalls of the bit lines. A material of the second filling layer 231 includes, but is not limited to, an oxide such as silicon oxide. The second filling layer is configured for isolation and protection between the bit lines. In practice, the second filling layer 231 may be formed by atomic layer deposition (ALD), chemical vapor deposition (CVD) or the like.

In some embodiments, after forming the second filling layer, the method further includes the following operations. The second protective layer is removed. Gate dielectric layer is formed. The gate dielectric layer covers a sidewall of a semiconductor pillar. A word line material layer is formed on the second filling layer. The word line material layer is etched along the second direction to form a plurality of word lines extending along the second direction, and the word lines wrap the gate dielectric layer. In practice, the gate dielectric layer may be formed by in-situ thermal oxidation to convert part of each semiconductor pillar into an oxide. A material of the word line includes, but is not limited to, tungsten, copper, titanium, tantalum, titanium nitride, tantalum nitride, metal silicide, metal alloy, or any combination thereof.

The embodiments of the disclosure also provide a semiconductor structure, as shown in FIGS. 18A-18D, including: a semiconductor substrate 203, a plurality of semiconductor fins 205, doped regions 225 and bit lines 229. The a plurality of semiconductor fins 205 extend along a first direction on the semiconductor substrate 203, and each of the semiconductor fins 205 includes a plurality of semiconductor pillars 219 and connecting ridges 221 connecting two adjacent ones of the semiconductor pillars 219. Upper surfaces of the connecting ridges 221 are lower than upper surfaces of the semiconductor pillars 219. The doped regions 225 extend along the first direction, and are located at the tops and sidewalls of the connecting ridges 221 and at the lower portions of the semiconductor pillars 219. The bit lines 229 extend along the first direction and cover part of the tops and sidewalls of the doped regions 225. In some embodiments, a material of the bit lines includes a metal silicide, which includes, but is not limited to, cobalt silicide, titanium silicide, or nickel silicide. The embodiments of the disclosure provide a semiconductor structure which improves quality of the bit lines, optimizes interconnection effect of the bit lines, reduces contact resistance of the bit lines, and improves bit line signal transmission rate.

In some embodiments, the semiconductor structure further includes first filling layer 207. The first filling layer 207 at least partially fills gaps between two adjacent ones of the semiconductor fins 205. The upper surface of the connecting ridge 221 is higher than the upper surface of the first filling layer 207 at both sides of the connecting ridge 221, and tops and sidewalls of the bit lines 229 are exposed from the first filling layer 207. A material of the first filling layer 207 includes, but is not limited to, an oxide such as silicon oxide. With the upper surface of the connecting ridge is higher than the upper surface of the first filling layer at both sides of the connecting ridge, three surfaces of each the connecting ridges (i.e., the sidewalls and the top) are exposed. In the process of forming metal silicide, metal can react with substrate not only from the top of the connecting ridge, but also from the sidewalls, which increases the contact area between metal and substrate and makes it easier to form high-quality interconnected metal silicide. In addition, because the sidewalls and the top of each the connecting ridges, three surfaces, are exposed at the same time, enough metal can participate in the reaction to form metal silicide, and the problem of insufficient metal in the metal silicide reaction is solved.

In some embodiments, the semiconductor structure further includes a second filling layer 231 that fills gaps between adjacent two of the bit lines 229 and covers the tops and sidewalls of the bit lines 229. A material of the second filling layer 231 includes, but is not limited to, an oxide such as silicon oxide. The second filling layer is configured for isolation and protection between the bit lines.

In some embodiments, an etching selection ratio between a material of the first filling layer 207 and a material of the semiconductor fins 205 is high. By utilizing the different etching rates of the first filling layer 207 and the semiconductor fins 205, the upper surface of the connecting ridge can be higher than the upper surface of the filling layer at both sides of each of the connecting ridges in one operation and with high efficiency.

In some embodiments, a height difference between the upper surface of the connecting ridge 221 and the upper surface of the first filling layer 207 at both sides of the connecting ridge 221 is 20-30 nm. When the height difference is too large, there are difficulties in the subsequent filling process. When the height difference is too small, the exposed area of the sidewalls of the connecting ridges is too small, so it is not conducive to the formation of high-quality interconnected metal silicide.

In some embodiments, the semiconductor structure further includes a first protective layer 211 above the semiconductor pillars 219. By arranging the first protective layer above the structure to be processed, the semiconductor pillars formed subsequently can be effectively protected from oxidation, nitridation, damage or pollution in subsequent processes.

In some embodiments, a ratio between the height difference between the upper surface of the connecting ridge 221 and the upper surface of the first filling layer 207 at both sides of the connecting ridges 221 and a thickness of the first protective layer 211 is 0.5-1. When the ratio is too large, it is difficult to control the height difference between the connecting ridge and the filling layer at both sides of the connecting ridge. When the ratio is too small, inefficiency is leaded and a limitation of the thickness of the first protective lays is not conducive to achieving a desire height difference.

In some embodiments, the semiconductor structure further includes a plurality of word lines extending along a second direction intersecting the first direction. The word lines are located above the second filling layer and wrap the sidewalls of the semiconductor pillars. A material of the word lines includes, but is not limited to, tungsten, copper, titanium, tantalum, titanium nitride, tantalum nitride, metal silicide, metal alloy, or any combination thereof.

In some embodiments, the semiconductor structure further includes gate dielectric layer. The gate dielectric layer is located between a word line and a semiconductor pillar.

To sum up, in the embodiments of the disclosure, after etching the semiconductor fins and the first filling layer, the upper surface of the connecting ridge is higher than the upper surface of the first filling layer at both sides of the connecting ridges, thereby exposing three surfaces (i.e., the sidewalls and the top) of each the connecting ridges. In a subsequent process of forming metal silicide, metal can react with the substrate not only from the top of the connecting ridge, but also from the sidewalls, which increases the contact area between the metal and the substrate, and makes it easier to form high-quality interconnected metal silicide. In addition, because the sidewalls and the top of each the connecting ridges, three surfaces, are exposed at the same time, enough metal can participate in the reaction to form metal silicide, and the problem of insufficient metal in the metal silicide reaction is solved.

It should be noted that the semiconductor structure, the forming method and the manufacturing apparatus provided by the embodiments of the disclosure can be applied to any integrated circuit including the structure. The technical features in the technical solutions described in each embodiment can be arbitrarily combined without conflict. Those skilled in the art can change the sequence of the steps of the above forming method without leaving the protection scope of the disclosure. Under the condition that the steps in the embodiments of the present disclosure do not conflict, some steps can be executed simultaneously or sequentially.

The above is only the preferred embodiments of the disclosure, and is not intended to limit the protection scope of the disclosure. Any modification, equivalent replacement and improvement made within the spirit and principles of the disclosure shall be included in the protection scope of the disclosure.

What is claimed is:

1. A semiconductor structure comprising:
    a semiconductor substrate;
    a plurality of semiconductor fins on the semiconductor substrate extending along a first direction, wherein each of the semiconductor fins comprises a plurality of semiconductor pillars and connecting ridges connecting two adjacent ones of the semiconductor pillars, and an upper surface of the connecting ridge is lower than an upper surface of a semiconductor pillar;
    doped regions, extending along the first direction and located at tops and sidewalls of the connecting ridges and at lower portions of the semiconductor pillars; and
    bit lines, extending along the first direction and covering tops and sidewalls of the doped regions.

2. The semiconductor structure according to claim 1, further comprising:
    a first filling layer, at least partially filling gaps between two adjacent ones of the semiconductor fins, wherein the upper surface of the connecting ridge is higher than an upper surface of the first filling layer at both sides of the connecting ridge, and tops and sidewalls of the bit lines are exposed from the first filling layer.

3. The semiconductor structure according to claim 1, further comprising:
    a second filling layer, filling gaps between two adjacent ones of the bit lines and covering tops and sidewalls of the bit lines.

4. The semiconductor structure according to claim 2, wherein an etching selection ratio between a material of the first filling layer and a material of the semiconductor fins is high.

5. The semiconductor structure according to claim 2, wherein a height difference between the upper surface of the connecting ridge and the upper surface of the first filling layer at both sides of the connecting ridge ranges from 20-30 nm.

6. The semiconductor structure according to claim 2, further comprising:
    a first protective layer, located above the semiconductor pillars.

7. The semiconductor structure according to claim 6, wherein a ratio of a height difference between the upper surface of the connecting ridge and the upper surface of the first filling layer at both sides of the connecting ridge to a thickness of the first protective layer ranges from 0.5-1.

* * * * *